US006903614B2

United States Patent
Jacobsson et al.

(10) Patent No.: US 6,903,614 B2
(45) Date of Patent: Jun. 7, 2005

(54) OSCILLATOR HAVING AN AC-COUPLING BETWEEN FUNDAMENTAL FREQUENCY GROUND POINTS

(75) Inventors: Harald Jacobsson, Västra Frölunda (SE); Bertil Hansson, Agnesberg (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 10/751,104

(22) Filed: Jan. 5, 2004

(65) Prior Publication Data

US 2004/0150484 A1 Aug. 5, 2004

Related U.S. Application Data

(63) Continuation of application No. PCT/SE02/01209, filed on Jun. 20, 2002.

(30) Foreign Application Priority Data

Jul. 5, 2001 (SE) .............................................. 0102421

(51) Int. Cl.[7] .................................................. H03B 5/02
(52) U.S. Cl. .................. 331/46; 331/117 R; 331/108 A
(58) Field of Search ............................. 331/46, 45, 50, 331/38, 108 A, 108 B, 135, 117 R, 117 FE

(56) References Cited

U.S. PATENT DOCUMENTS

| 5,379,457 | A | | 1/1995 | Nguyen ........................ 455/323 |
| 5,912,596 | A | * | 6/1999 | Ghoshal .................. 331/117 R |
| 6,008,701 | A | * | 12/1999 | Gilbert ......................... 331/57 |
| 6,249,190 | B1 | | 6/2001 | Rozenblit et al. .............. 331/46 |
| 6,456,167 | B1 | * | 9/2002 | Huang .......................... 331/46 |
| 6,462,626 | B1 | * | 10/2002 | Gharpurey .............. 331/108 B |
| 6,687,494 | B1 | * | 2/2004 | Mourant ....................... 455/326 |
| 2004/0127172 | A1 | * | 7/2004 | Gierkink et al. .............. 455/91 |

FOREIGN PATENT DOCUMENTS

| EP | 0 909 018 A1 | 4/1999 |
| GB | 2 338 849 A | 12/1999 |

* cited by examiner

Primary Examiner—Robert Pascal
Assistant Examiner—Joseph Chang
(74) Attorney, Agent, or Firm—Nixon & Vanderhye, P.C.

(57) ABSTRACT

A method of locking a first differential oscillator with a second differential oscillator and a circuit and an arrangement therefor. The method comprises AC coupling a fundamental frequency AC-ground of the first differential oscillator with a fundamental frequency AC-ground of the second differential oscillator.

26 Claims, 8 Drawing Sheets

OSCILLATOR HAVING AN AC-COUPLING BETWEEN FUNDAMENTAL FREQUENCY GROUND POINTS

This application is a continuation of PCT International Application No. PCT/SE02/01209, filed in English on 20 Jun. 2002, which designated the U.S. PCT/SE02/01209 claims priority to SE Application No. 0102421.5 filed 5 Jul. 2001. The entire contents of these applications are incorporated herein by reference.

TECHNICAL FIELD

The invention concerns oscillators and is more particularly directed to the locking of two or more oscillators together, especially differential oscillators.

BACKGROUND

Oscillators are used in most types of electronic circuitry. In some applications the frequency accuracy and stability are of a lesser importance, in other applications it is extremely important that an oscillator has a pure frequency spectrum with a very low phase noise. One type of application where these demands are set very high is in communication systems. Oscillators in communication systems are often considered as building blocks that ought to be small, preferably integrated, have a low manufacturing cost, be reliable, have a low power consumption and also fulfill among the most strict signal quality requirements. In many communication systems four orthogonal phases (quadrature) of the oscillator signal are required requiring further power and space consuming circuitry. Obtaining these characteristics is a difficult task, especially if the oscillator building block is to be realized on an integrated circuit with a limited semiconductor area available and a limited available power, without any external components.

There have been several attempts to come to grips with these contradictory but very desirable oscillator qualities. One way to improve the phase noise of an oscillator is to lock two oscillators together. This has traditionally led to mote than a doubled required semiconductor area to avoid the resonators of the oscillators from interfering with each other, and to make room for the additional circuitry required to lock them together. This additional circuitry, apart from the additional oscillator, will increase the total power consumption of the building block. Increased power and increased occupied area are particularly undesirable oscillator building block characteristics for portable, usually battery powered communication equipment, such as cellular phones. There seem to still exist room for improvement on oscillator building blocks.

SUMMARY

An object of the invention is to define a method of reducing phase noise of oscillators, especially differential oscillators.

A further object of the invention is to define a method of creating an oscillator circuit with accurate four orthogonal phases.

A still further object of the invention is to define an oscillator with four orthogonal phases with a low phase noise.

The aforementioned objects are achieved according to the invention by a method of locking a first differential oscillator with a second differential oscillator and a circuit and an arrangement therefore. The method comprises AC coupling a fundamental frequency AC-ground of the first differential oscillator with a fundamental frequency AC-ground of the second differential oscillator.

The aforementioned objects are further achieved according to the invention by an oscillator circuit comprising at least two differential oscillators. The differential oscillators comprising at least one fundamental frequency AC-ground point each. According to the invention the oscillator circuit comprises at least one AC coupling between one of the at least one fundamental frequency AC-ground points of one of the differential oscillators and one of the at least one fundamental frequency AC-ground points of another one of the differential oscillators.

The aforementioned objects are also achieved according to the invention by an oscillator circuit comprising a first differential oscillator and a second differential oscillator. The first differential oscillator comprises at least one fundamental frequency AC-ground point. The second differential oscillator comprises at least one fundamental frequency AC-ground. The first differential oscillator and the second differential oscillator have substantially the same fundamental frequencies. According to the invention the oscillator circuit comprises a first AC coupling between one of the at least one fundamental frequency AC-ground points of the first differential oscillator and one of the at least one fundamental frequency AC-ground points of the second differential oscillator, thus locking the first differential oscillator to the second differential oscillator.

Advantageously the oscillator circuit comprises a first quadruple frequency output, the first quadruple frequency output being coupled to the first AC coupling. Suitably the first differential oscillator and the second differential oscillator are substantially identical. Suitably the first AC coupling is between a first fundamental frequency AC-ground point of the first differential oscillator and a first fundamental frequency AC-ground point of the second differential oscillator, the first fundamental frequency AC-ground points being identical fundamental frequency AC-ground points.

Suitably the oscillator circuit comprises four fundamental frequency outputs, the four outputs being in quadrature.

In some embodiments the oscillator circuit comprises a second AC coupling between a second fundamental frequency AC-ground point of the first differential oscillator and a second fundamental frequency AC-ground point of the second differential oscillator, the second fundamental frequency AC-ground points being identical fundamental frequency AC-ground points. The oscillator circuit can comprise a second quadruple frequency output, the second quadruple frequency output being coupled to the second AC coupling, the first and second quadruple frequency outputs being differential.

In some embodiments the oscillator circuit comprises a third differential oscillator having at least a first fundamental frequency AC-ground point. Suitably either the first AC coupling is further AC coupled to the first fundamental frequency AC-ground point of the third differential oscillator, or the oscillator circuit comprises a second AC coupling between a second fundamental frequency AC-ground point of the first differential oscillator and a second fundamental frequency AC-ground point of the third differential oscillator, the second fundamental frequency AC-ground points being identical fundamental frequency AC-ground points and separate from the first fundamental frequency AC-ground points. Advantageously the third differential oscillator either has substantially a same fundamental frequency as the first and second differential oscillators, or has a fundamental frequency which is substantially twice the frequency as the fundamental frequencies of the first and second differential oscillators.

In some embodiments the oscillator circuit comprises a fourth differential oscillator having at least a first fundamental frequency AC-ground point. Advantageously either the first AC coupling is further AC coupled to the first fundamental frequency AC-ground point of the fourth differential oscillator, or the oscillator circuit further comprises a third AC coupling between a fundamental frequency AC-ground point of the second differential oscillator being separate from the first fundamental frequency AC-ground point and a corresponding fundamental frequency AC-ground point of the fourth differential oscillator.

Suitably the fourth differential oscillator either has a fundamental frequency which is substantially the frequency of the fundamental frequency of the first and second differential oscillator, or has a fundamental frequency which is substantially twice the frequency of the fundamental frequency of the first and the second differential oscillator, or has a fundamental frequency which is substantially twice the frequency of the fundamental frequency of the third differential oscillator.

Suitably one AC coupling between two fundamental frequency AC-ground points, is further coupled to either a voltage source via an AC-impedance element, or to ground via an AC-impedance element.

Advantageously one AC coupling between two fundamental frequency AC-ground points is either a direct coupling, a resistive coupling, or a capacitive coupling.

The aforementioned objects are further achieved according to the invention by a communication unit the communication unit comprises an oscillator circuit according to any one of the above described embodiments.

The aforementioned objects are also achieved according to the invention by a method of frequency locking a first differential oscillator to a second differential oscillator. According to the invention the method comprises AC coupling a fundamental frequency AC-ground of the first differential oscillator with a fundamental frequency AC-ground of the second differential oscillator.

By providing a differential oscillator according to the invention a plurality of advantages over prior art oscillators are obtained. A primary purpose of the invention is to provide an improved differential oscillator with a high quality signal output in quadrature. This is obtained according to the invention by AC coupling fundamental frequency AC-ground points of differential oscillators to frequency lock them together. By locking two or more differential oscillators together according to the invention the phase noise of each oscillator is reduced by up to 3n dB, where $2^n$ is the number of coupled oscillators. Further, a pair of differential oscillators lock in such a way that the output of the two oscillators are in quadrature. Still further, the major remnant frequency component at the coupling point between two connected differential oscillators is four times the fundamental frequency, thereby providing frequency multiplication.

Quadrature output is attained and the phase noise can be reduced by 3 dB by coupling two differential oscillators together according to the invention, without occupying more space or consuming any extra power for the coupling.

Other advantages of this invention will become apparent from the detailed description.

BRIEF DESCRIPTION OF THE DRAWINGS

The invention will now be described in more detail for explanatory, and in no sense limiting, purposes, with reference to the following figures, in which.

DETAILED DESCRIPTION

Figure 1:
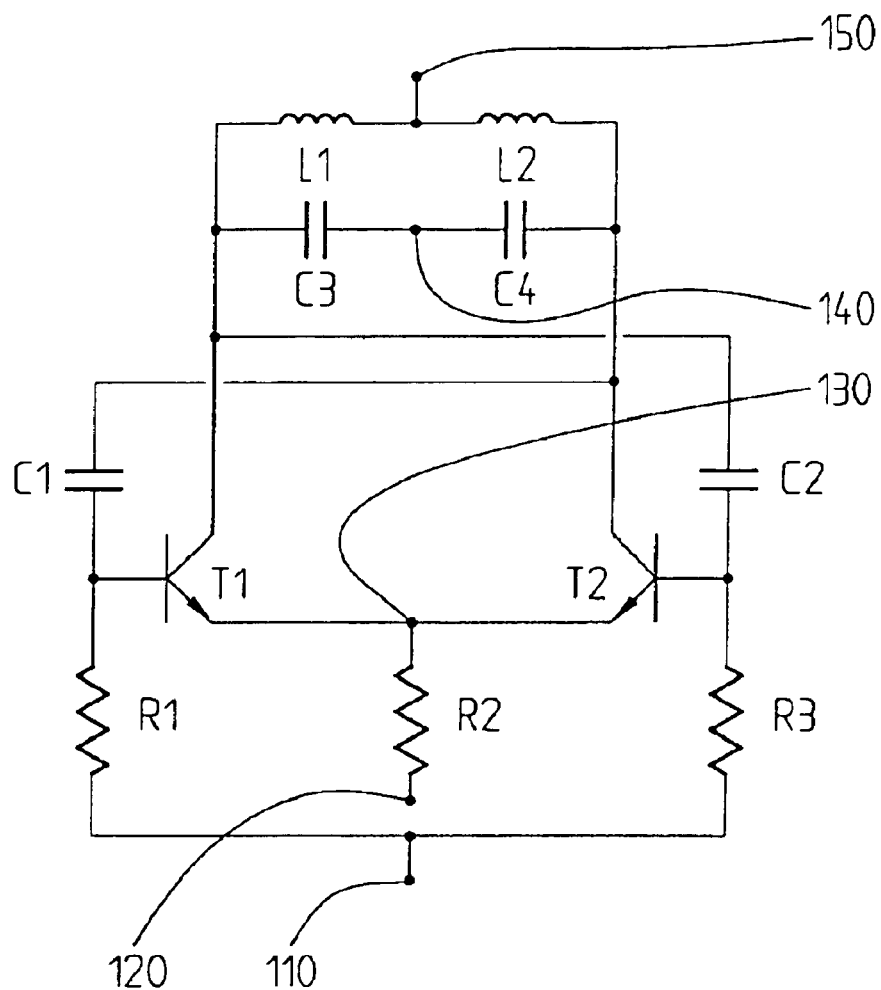
FIG. 1 shows a schematic of a differential oscillator.

FIG. 1 shows an example of a differetial LC oscillator. The differential LC oscillator comprises a resonance circuit with a capacitor part C3, C4 and an inductor part L1, L2. The oscillator of this example is of a paralell resonance type. The differential LC oscillator further comprises a drive part with transistors T1, T2 resistors R1, R2, R3 and capacitors C1, C2.

The resonance frequency, i.e. the frequency with which an LC oscillator will oscillate, its fundamental frequency, is approximately given by $f_o=1/(2\cdot\pi\cdot(L\cdot C)^{1/2})$, where L is the inductance of the resonator and C is the capacitance of the resonator. In a parallel resonance, as in this example, the impedance of the resonance circuit is high. On the other hands, if it were a serial resonance LC oscillator, then resonance would occur when the serial resonance circuit has a low impedance.

The capacitor part C3, C4, of the resonator is illustrated as divided into two capacitors C3 and C4. The inductor L1, L2 of the resonator is also illustrated as divided into two inductors L1 and L2, which can also be viewed as a single center tapped inductor. Given this, the fundamental frequency of this differential parallel resonance LC oscillator can be approximated by $f_o=1/(2\cdot\pi\cdot(L1\cdot C3)^{1/2})$ if L1=L2 and C3=C4, due to the differential oscillator symmetry. The capacitor part C3, C4, of the resonator is divided into two capacitors to create a fundamental frequency AC-ground point 140. The inductor L1, L2 of the resonator is divided into two inductors L1, L2 to thereby create for this example a necessary DC biasing point 150 which also acts as a fundamental frequency AC-ground point. The differential LC oscillator further comprises one fundamental frequency AC-ground point 130 and two combined fundamental frequency AC-ground and DC biasing points 110, 120. A fundamental frequency AC-ground point is a point where the fundamental frequency of a differential oscillator is effectively cancelled due to the symmetry of the differential oscillator. A fundamental frequency AC-ground further comprises only odd harmonics, i.e. even multiples of the fundamental frequency, the first harmonic usually being the dominant one.

The invention is based on the basic inventive idea of AC coupling one fundamental frequency AC point of one differential oscillator to one fundamental frequency AC point of another differential oscillator to thereby let the two differential oscillators strive to cancel out the dominant harmonic at the AC coupled fundamental frequency AC-ground points. The reason that the differential oscillators will strive to cancel out the dominant harmonic is that the AC coupled points are AC-ground points. The differential oscillators will therefore be 90° out of phase (to be able to cancel the dominant harmonic), i.e. in quadrature, and of the same frequency. Each differential oscillator provides 0° and 180°, these will be 90° apart, thus providing 0°, 90°, 180°, and 270° from two coupled differential oscillators, which phases are very useful in different types of equipment, especially communication equipment. The dominant frequency that is left at the coupling point will be four times the fundamental frequency of the differential oscillators, unless there is a weak AC coupling in which case the double frequency can be the dominant one. This frequency can be tapped and used, thus in a simple way frequency multiplying. The frequency difference between two, or more, differential oscillators of the same frequency that are to be frequency locked according to the invention should preferably only differ in frequency in the order of 10% or less.

The invention is not restricted to the use of a parallel or a serial resonance LC oscillator, nor to fixed frequency or tunable oscillators, the only restriction the invention puts on the oscillators used is that they both have to have at least one fundamental frequency AC-ground point each.

Figure 2:
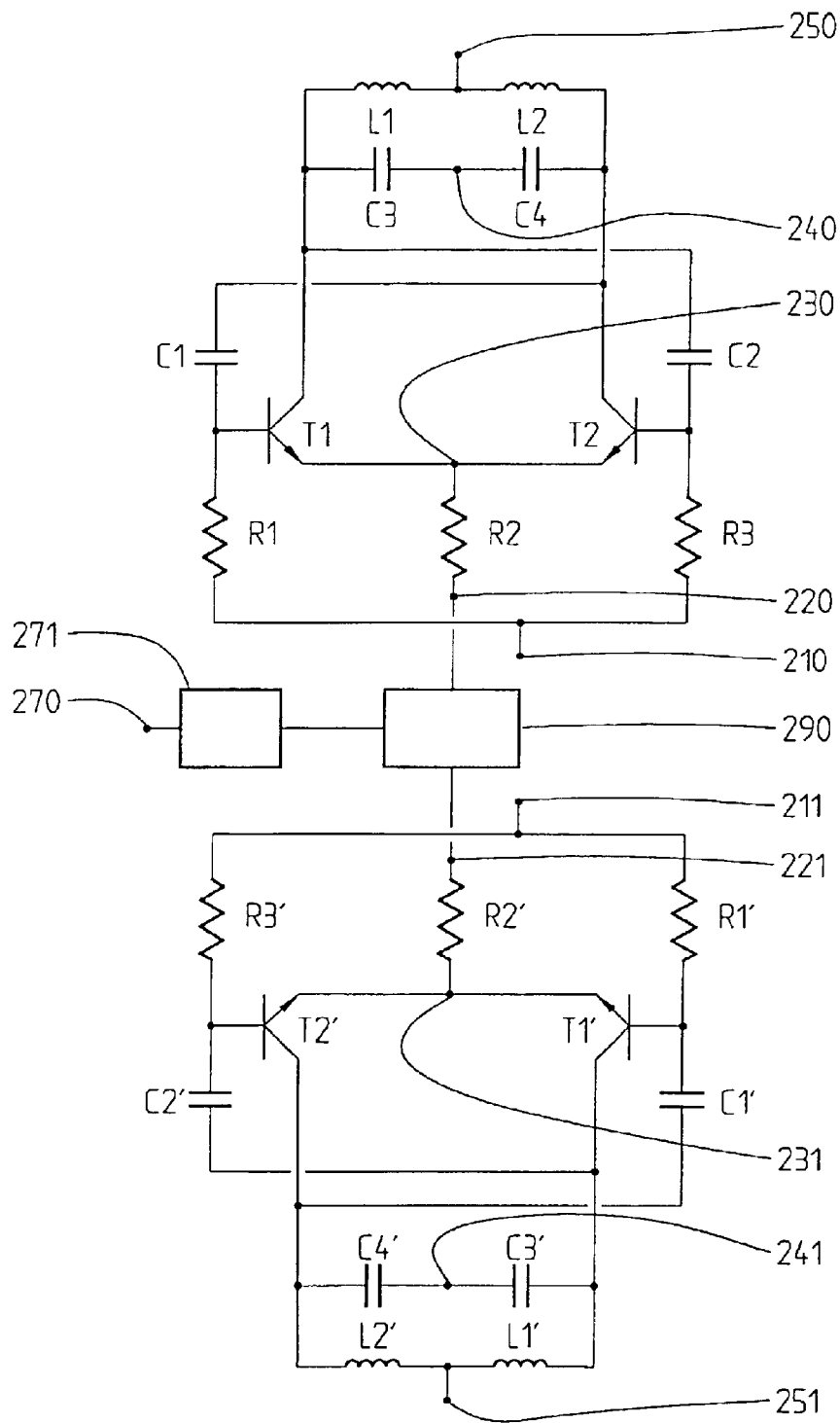
FIG. 2 shows a schematic of two differential oscillators coupled together according to one basic embodiment according to the invention.

FIG. 2 shows a schematic of two differential oscillators coupled together according to one basic embodiment according to the invention. Each differential LC oscillator comprises a resonance circuit part with a respective capacitor part C3, C4, C3', C4' and a respective inductor part L1, L2, L1', L2'. Each differential LC oscillator further comprises a drive part with transistors T1, T1', T2, T2', resistors R1, R1', R2, R2', R3, R3' and capacitors C1, C1', C2, C2'.

Each differential oscillator comprises a first 210, 211, a second 220, 221, a third 230, 231, a fourth 240, 241, and a fifth 250, 251 fundamental frequency AC-ground point. This basic example couples the second fundamental frequency AC-points 220, 221 with each other via an AC coupling element 290. The AC coupling element 290 can be capacitive, resistive, direct coupled, or the like. If there is a weak AC coupling, then the first harmonic might not be cancelled completely. The fundamental frequency AC-ground points of the differential oscillators that are coupled together are preferably the same type of point so that the coupled points have the same amplitude. Otherwise some sort of matching might be needed in the coupling. As the second fundamental frequency AC-points 220, 221 are also DC biasing points of the differential oscillators, these points are also coupled to a DC biasing point 270 via a DC coupling element 271. The DC coupling element can suitably be resistive, inductive or direct coupled.

When the differential oscillators have frequency locked, then ideally the first harmonic ($2f_o$) will have been completely cancelled at the fundamental frequency AC-ground points that are AC coupled. The other fundamental frequency AC-ground points will still have the first harmonic present, and they will be differential between the two differential oscillators. In this example, the third fundamental frequency AC-ground points 230, 231 can be as $2f_o$ differential outputs.

Figure 3A:
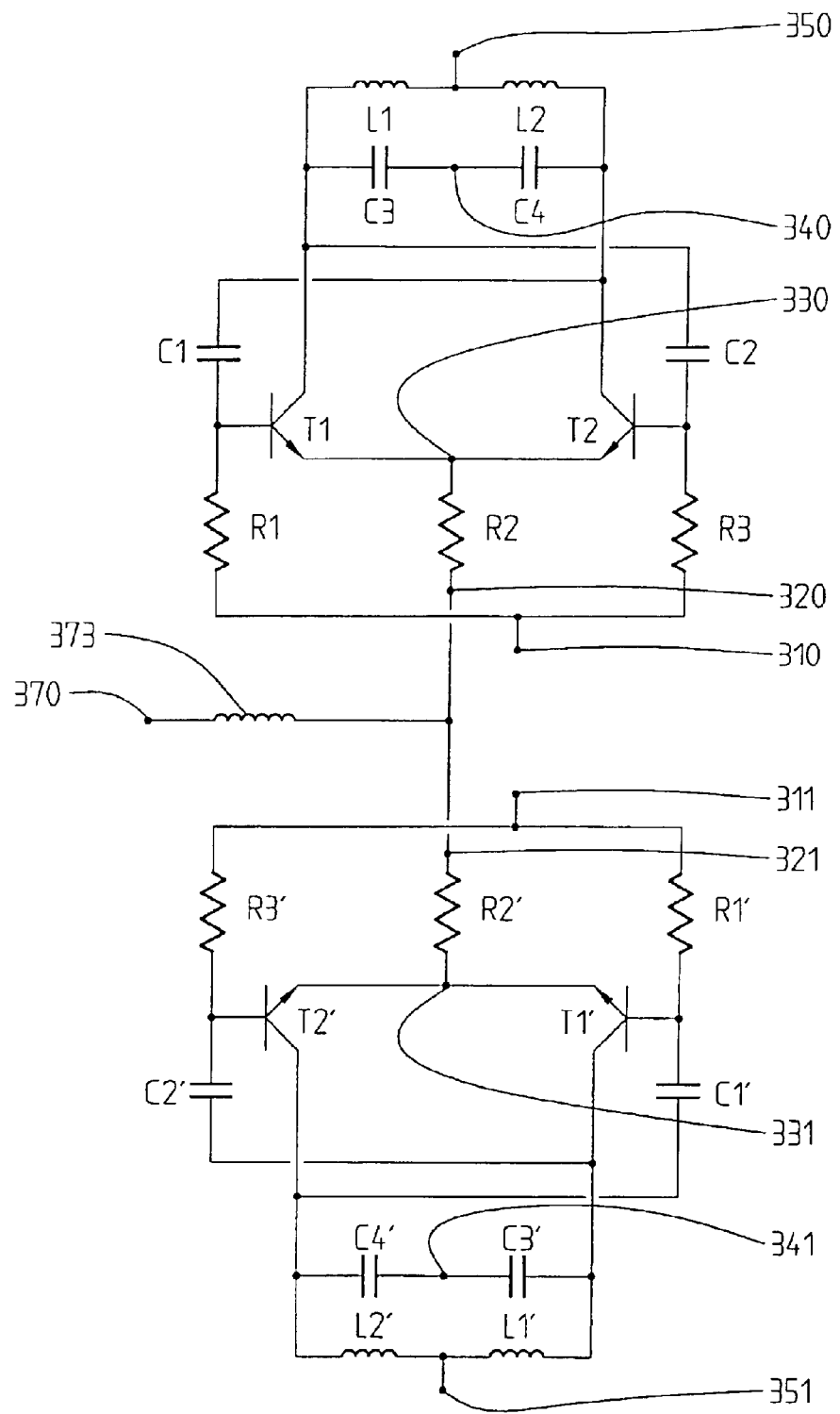
FIGS. 3A–3C show schematics of two differential oscillators coupled together according to different embodiments according to the invention.
Figure 3B:
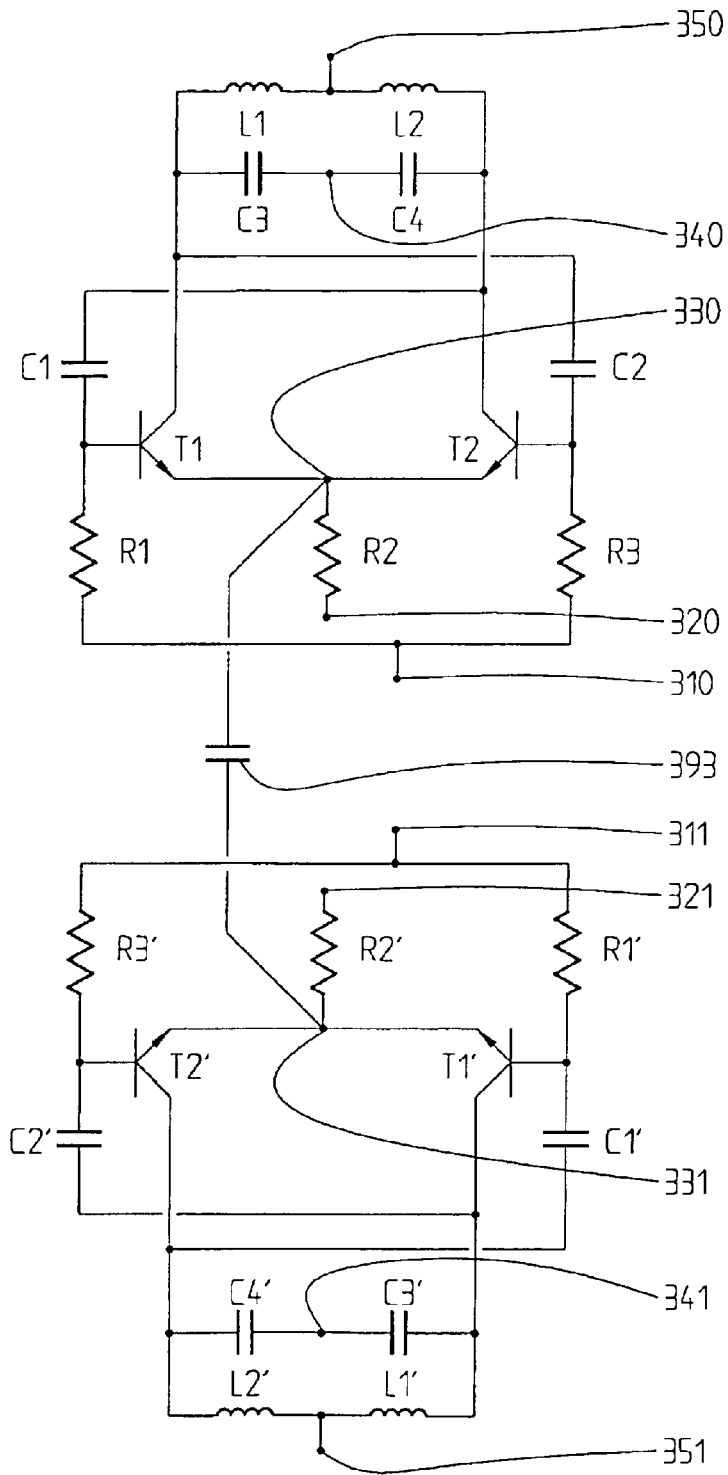
Figure 3C:
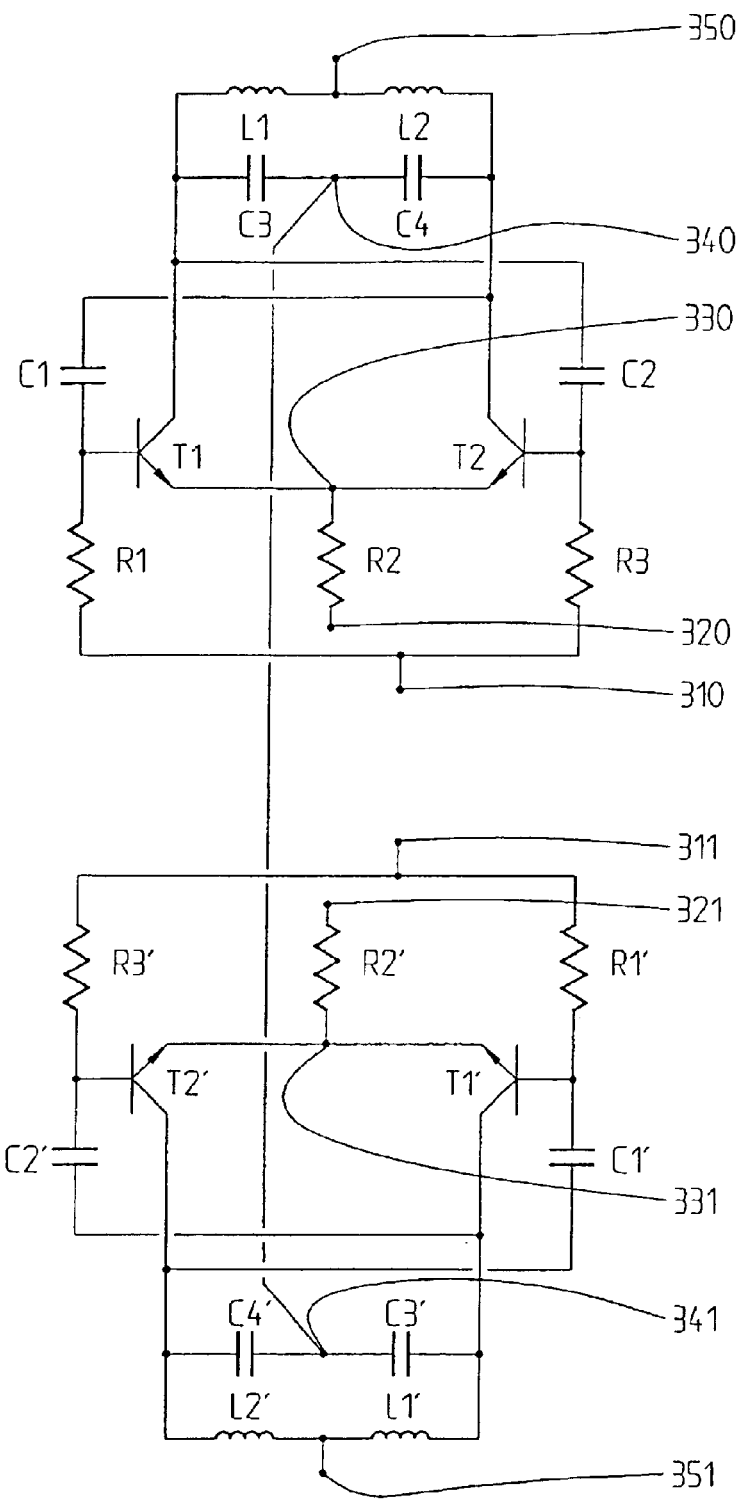

FIGS. 3A to 3C show suitable embodiments of locked differential oscillators according to the invention. Each differential LC oscillator comprises a resonance circuit part with a respective capacitor part C3, C4, C3', C4' and a respective inductor part L1, L2, L1', L2'. Each differential LC oscillator further comprises a drive part with transistors T1, T1', T2, T2', resistors R1, R1', R2, R2', R3, R3' and capacitors C1, C1', C2, C2'. Further, each differential oscillator comprises a first 310, 311, a second 320, 321, a third 330, 331, a fourth 340, 341, and a fifth 350, 351 fundamental frequency AC-ground point.

FIG. 3A shows how the second fundamental frequency AC-ground points 320, 321 are directly coupled together. These fundamental frequency AC-ground points 320, 321 are also DC biasing points of the differential oscillators. Therefore a DC biasing 370 is needed, which is suitably connected to the fundamental frequency AC-ground points 320, 321 by means of an inductor 373, which is a good DC coupling but AC blocking element.

FIG. 3B shows how the third fundamental frequency AC-ground points 330, 331 are coupled together via an AC coupling element, a capacitor 393. These fundamental frequency AC-ground points 330, 331 are not DC biasing points of the differential oscillators. Therefore, DC biasing is not needed here.

FIG. 3C shows in this third example how the fourth fundamental frequency AC-ground points 340, 341 are directly coupled together. These fundamental frequency AC-ground points 340, 341 do not require any DC biasing either. The fourth fundamental frequency AC-ground points 340, 341 were created by splitting the capacitor of the resonator into two capacitors C3, C3', C4, C4'. The two capacitors are suitably of an equal size.

As mentioned before, it is also possible to couple different fundamental frequency AC-ground points together, for example a first fundamental frequency AC-ground point of a first differential oscillator with a second fundamental frequency AC-ground point of a second differential oscillator. However, in these cases extra care has to be observed to, for example, match the amplitudes. It is also possible to couple together more than one pair of fundamental frequency AC-ground points, for example a first fundamental frequency AC-ground point of a first differential oscillator with a first fundamental frequency AC-ground point of a second differential oscillator and a second fundamental frequency AC-ground point of the first differential oscillator with a second fundamental frequency AC-ground point of the second differential oscillator. There can also be more than two differential oscillators coupled together by means of their respective fundamental frequency AC-ground point.

Figure 4:
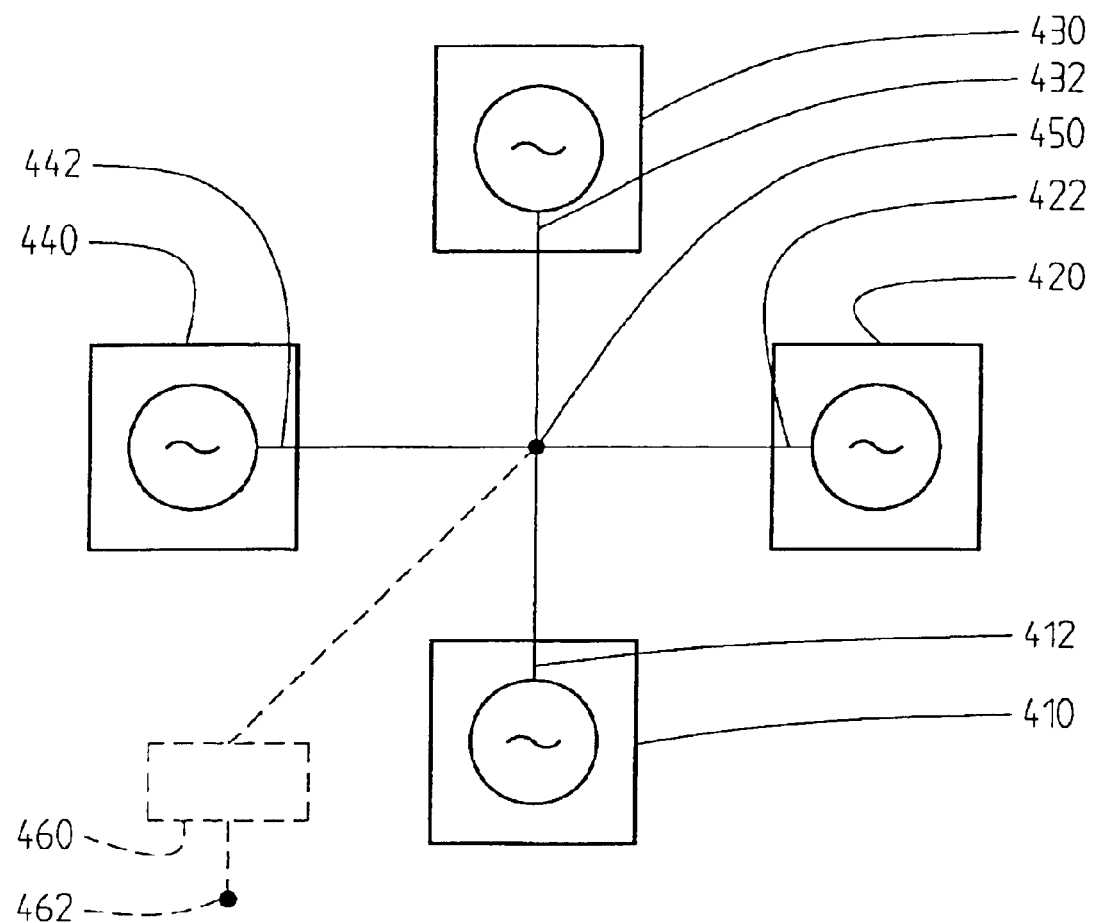
FIG. 4 shows a block diagram of four differential oscillators coupled together in a star configuration according to the invention.

FIG. 4 shows an example of four differential oscillators 410, 420, 430, 440 locked together according to the invention in a star configuration, i.e. a fundamental frequency AC-ground point 412, 422, 432, 442 of each differential oscillator 410, 420, 430, 440 is AC coupled together 450. If the fundamental frequency AC-ground points used are of the DC biasing type as well, then a DC biasing impedance 460 might be needed as well as a DC-biasing point 462. In a star configuration like this, it is possible to attain eight evenly spaced different phases. More or fewer differential oscillators can be frequency locked together in a star configuration such as this. To be noted is that a differential oscillator can use a same fundamental frequency AC-ground point for AC-coupling to two or more other differential oscillators.

Figure 5:
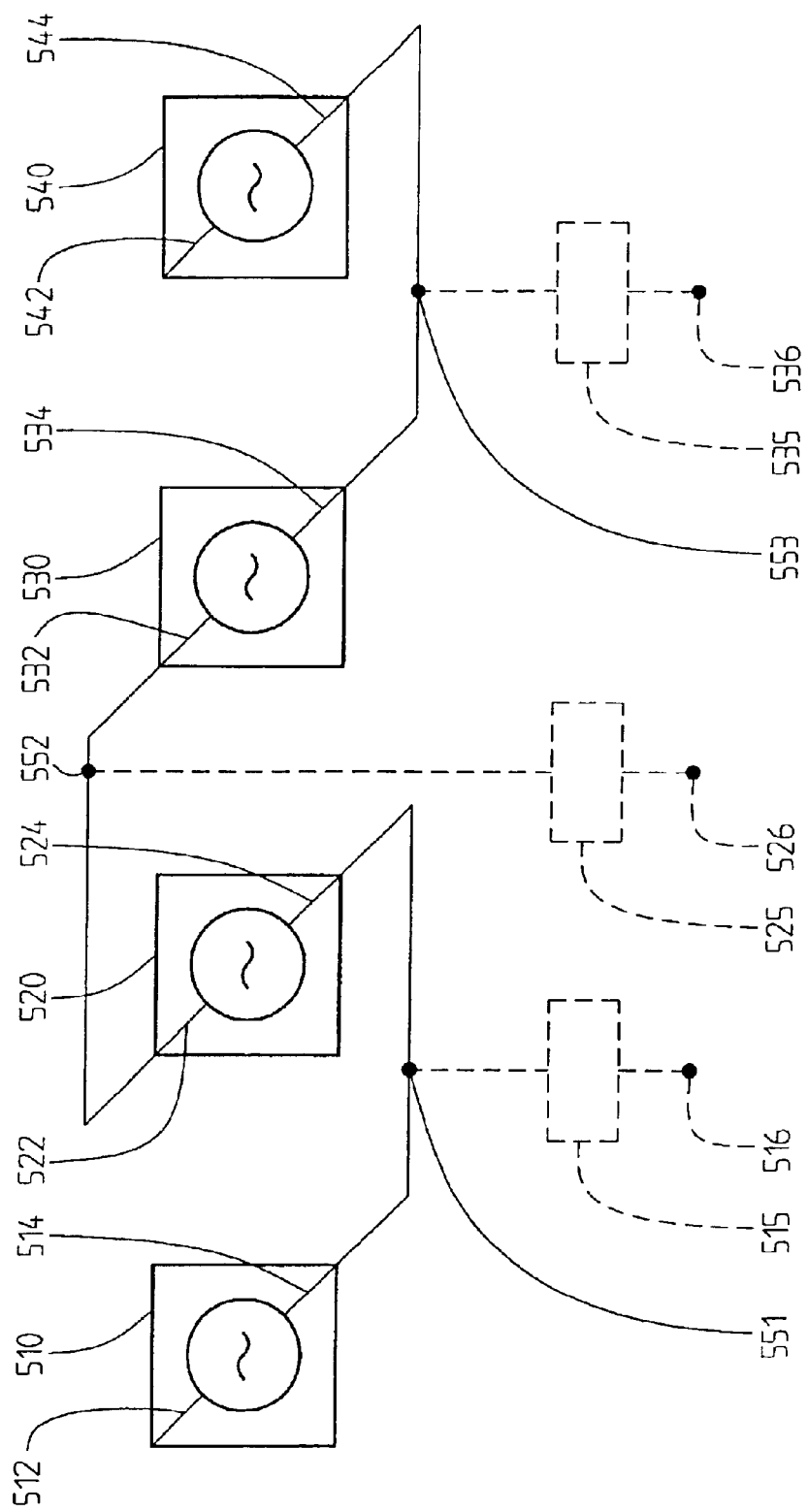
FIG. 5 shows a block diagram of four differential oscillators coupled together in a serial configuration according to the invention.

FIG. 5 shows an example of four differential oscillators 510, 520, 530, 540 frequency locked together according to the invention in a serial configuration, i.e. any differential oscillator 510, 520, 530, 540 is not AC coupled together with more than two other differential oscillators 510, 520, 530, 540 by means of the fundamental frequency AC-ground points 512, 514, 522, 524, 532, 534, 542, 544. In this example, a second fundamental frequency AC-ground point 514 of the first differential oscillator 510 is AC coupled 551 together with a second fundamental frequency AC-ground point 524 of the second differential oscillator 520. A first fundamental frequency AC-ground point 522 of the second differential oscillator 520 is AC-coupled 552 together with a first fundamental frequency AC-ground point 532 of the third differential oscillator 530. And a second fundamental frequency AC-ground point 534 of the third differential oscillator 530 is AC coupled 553 together with a second fundamental frequency AC-ground point 544 of the fourth differential oscillator 540. Optional DC biasing impedances 515, 525, 535 with corresponding DC biasing points 516, 526, 536 are indicated in the figure. More or fewer differential oscillators can be frequency locked together in a serial configuration such as this.

Not all of the differential oscillators that are being coupled together according to the invention need to have the same frequency. If two or more differential oscillators having the same frequency are to be coupled together, then they should preferably only differ in frequency in the order of 10% or less. But according to the invention differential oscillators with fundamental frequencies which are whole multiples of a basic fundamental frequency, can be frequency locked together.

Figure 6:
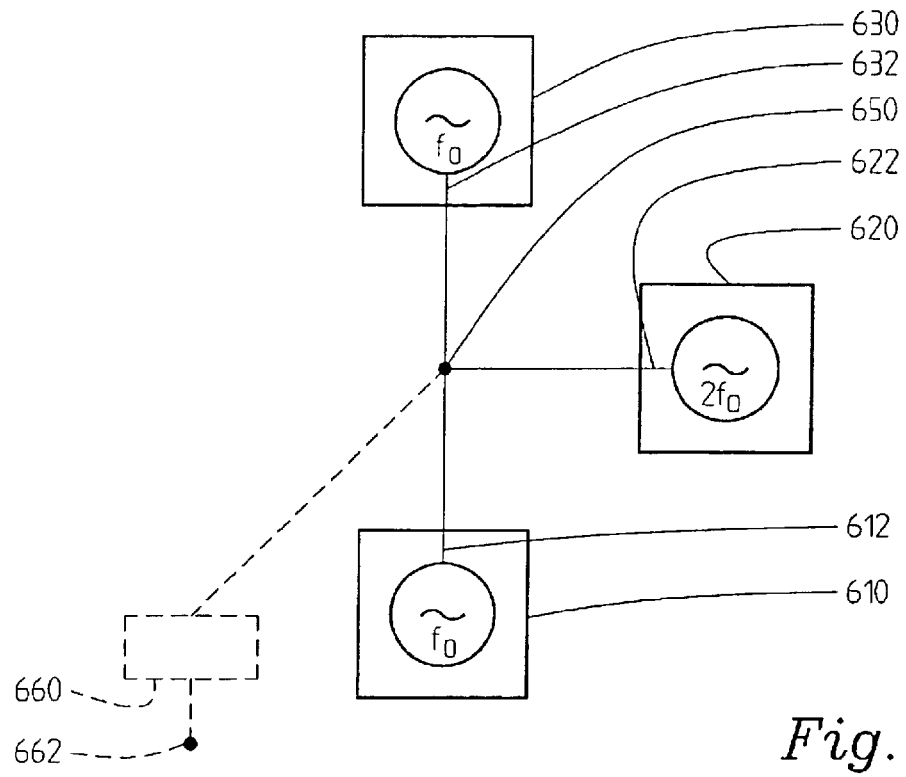
FIG. 6 shows a block diagram of three differential oscillators coupled together according to the invention.

FIG. 6 shows a first example of multiple frequency locking in a star configuration according to the invention. Two differential oscillators 610, 630, with corresponding fundamental frequency AC-ground points 612, 632, have a fundamental frequency of $f_o$. When AC-coupling the fundamental frequency AC-ground points 612, 632 together 650, then the first harmonic ($2f_o$) is cancelled at the common point 650, and the remaining dominant frequency at this point 650 is four times ($4f_o$) the fundamental frequency. A differential oscillator 620 that oscillates at twice ($2f_o$) the frequency of the other differential oscillators 610, 630, will have a dominant frequency at its fundamental frequency AC-ground point 622 which is four times ($4f_o$) the fundamental frequency of the other differential oscillators 610, 630. By coupling in this double frequency differential oscillator, the dominant quadruple frequencies ($4f_o$) of the fundamental frequency AC-ground points, will cancel, adjusting the phases differential oscillators 610, 620, 630 in the process. The dominating frequency at the coupling point will then be eight times ($8f_o$) the fundamental frequency ($f_o$), which is an efficient frequency multiplier that can be used. Possibly some sort of signal level adaptation might be needed to adjust any differences in harmonic frequency signal levels at the fundamental frequency AC-ground points of the different differential oscillators 610, 620, 630. Illustrated is a DC biasing impedance 660 as well as a DC-biasing point 662 that might be needed if the fundamental frequency AC-ground points used are of the DC biasing type as well.

Figure 7:
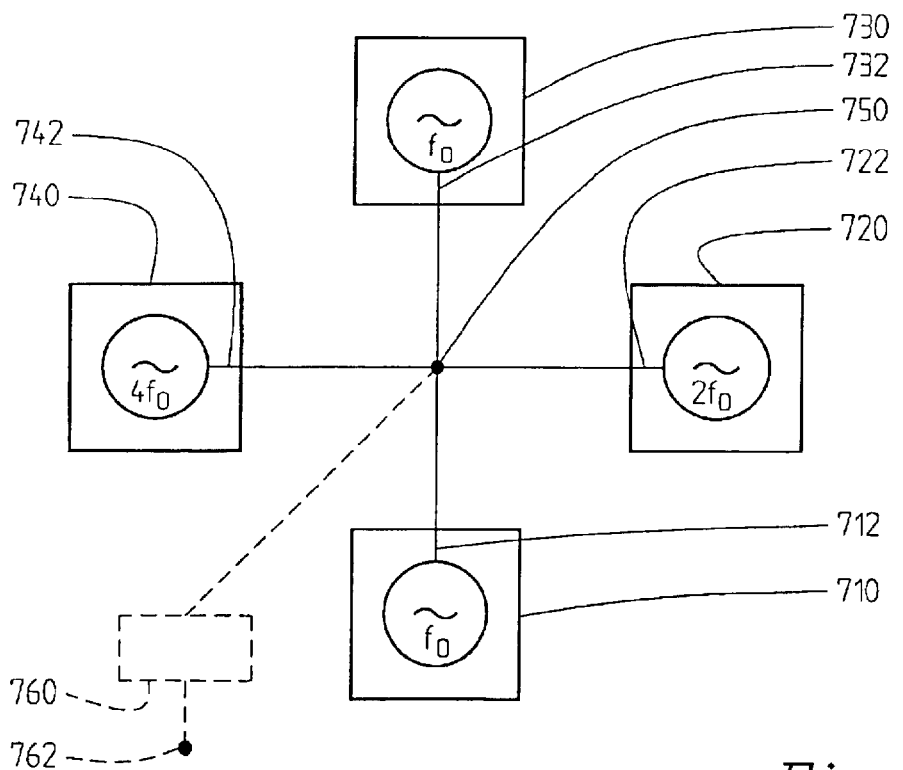
FIG. 7 shows a block diagram of four differential oscillators coupled together according to the invention.

FIG. 7 shows a second example of multiple frequency locking in a star configuration according to the invention. As described above in relation to FIG. 6, this example also comprises two differential oscillators 710, 730 with a basic ($f_o$) fundamental frequency, and one differential oscillator 720 with a double fundamental frequency ($2f_o$). In this example a fourth differential oscillator 740 with a quadruple fundamental frequency ($4f_o$) is also frequency locked. All of the differential oscillators comprise their corresponding fundamental frequency AC-ground point 712, 722, 732, 742, which are AC coupled together in a single point 750. A quadruple frequency ($4f_o$) differential oscillator 740 will have a dominating frequency at its fundamental frequency AC-ground points 742 that is eight times ($8f_o$) the basic frequency ($f_o$). This will cancel with the dominating frequency from the other three differential oscillators 710, 720, 730, leaving a dominating frequency of sixteen times ($16f_o$) the basic frequency ($f_o$) at the coupling point 750. This frequency can of course be used, if desired. Illustrated is a DC biasing impedance 760 as well as a DC-biasing point 762 that might be needed if the fundamental frequency AC-ground points used are of the DC biasing type as well.

Oscillators according to the invention as building blocks in communication systems are preferably realized on an integrated circuit and preferably without any external components.

The basic principle of the invention is to frequency lock differential oscillators to each other by AC coupling fundamental frequency AC-ground points of the differential oscillators with each other. This will lower the phase noise, provide quadrature phase outputs, and provide frequency multiplication, without increasing power consumption by any active coupling arrangements.

The invention is not restricted to the above described embodiments, but may be varied within the scope of the following claims.

FIG. 1—an example of a differential oscillator
C1 a first capacitor,
C2 a second capacitor,
C3, C4 third and fourth capacitors, two capacitors to create a fundamental frequency AC-ground point between them,
L1, L2 first and second inductors, basically a center tapped inductor for biasing and a fundamental frequency AC-ground point,
R1 first resistor,
R2 second resistor,
R3 third resistor,
T1 first transistor,
T2 second transistor,
110 bias point and first point of fundamental frequency AC-ground,
120 bias point and second point of fundamental frequency AC-ground,
130 third point of fundamental frequency AC-ground,
140 fourth point of fundamental frequency AC-ground,
150 bias point and fifth point of fundamental frequency AC-ground.

FIG. 2 a basic locking according to the invention of two differential oscillators
C1 a first capacitor of the first differential oscillator,
C1' a first capacitor of the second differential oscillator,
C2 a second capacitor of the first differential oscillator,
C2' a second capacitor of the second differential oscillator,
C3, C4 third and fourth capacitors of the first differential oscillator, two capacitors to create a fundamental frequency AC-ground point between them,
C3', C4' third and fourth capacitors of the second differential oscillator, two capacitors to create a fundamental frequency AC-ground point between them,
L1, L2 first and second inductors of the first differential oscillator, basically a center tapped inductor for biasing and a fundamental frequency AC-ground point,
L1', L2' first and second inductors of the second differential oscillator, basically a center tapped inductor for biasing and a fundamental frequency AC-ground point,
R1 first resistor of the first differential oscillator,
R1' first resistor of the second differential oscillator,
R2 second resistor of the first differential oscillator,
R2' second resistor of the second differential oscillator,
R3 third resistor of the first differential oscillator,
R3' third resistor of the second differential oscillator,
T1 first transistor of the first differential oscillator, T1' first transistor of the second differential oscillator,
T2 second transistor of the first differential oscillator,
T2' second transistor of the second differential oscillator,
210 bias point and first point of fundamental frequency AC-ground of the first differential oscillator,
211 bias point and first point of fundamental frequency AC-ground of the second differential oscillator,
220 bias point and second point of fundamental frequency AC-ground of the first differential oscillator,
221 bias point and second point of fundamental frequency AC-ground of the second differential oscillator,
230 third point of fundamental frequency AC-ground of the first differential oscillator,
231 third point of fundamental frequency AC-ground of the second differential oscillator,
240 fourth point of fundamental frequency AC-ground of the first differential oscillator,
241 fourth point of fundamental frequency AC-ground of the second differential oscillator,
250 bias point and fifth point of fundamental frequency AC-ground of the first differential oscillator,
251 bias point and fifth point of fundamental frequency AC-ground of the second differential oscillator.
270 biasing point for second point of fundamental frequency AC-ground of the first and second differential oscillators,
271 high AC impedance and low DC impedance element,
290 AC coupling element between the second point of fundamental AC-ground of the first differential oscillator and the second point of fundamental AC-ground of the second differential oscillator.
FIGS. 3A–3C, suitable embodiments of locked differential oscillators according to the invention,
C1 a first capacitor of the first differential oscillator,
C1' a first capacitor of the second differential oscillator,
C2 a second capacitor of the first differential oscillator,
C2' a second capacitor of the second differential oscillator,
C3, C4 third and fourth capacitors of the first differential oscillator, two capacitors to create a fundamental frequency AC-ground point between them,
C3', C4' third and fourth capacitors of the second differential oscillator, two capacitors to create a fundamental frequency AC-ground point between them,
L1, L2 first and second inductors of the first differential oscillator, basically a center tapped inductor for biasing and a fundamental frequency AC-ground point,
L1', L2' first and second inductors of the second differential oscillator, basically a center tapped inductor for biasing and a fundamental frequency AC-ground point,
R1 first resistor of the first differential oscillator,
R1' first resistor of the second differential oscillator,
R2 second resistor of the first differential oscillator,
R2' second resistor of the second differential oscillator,
R3 third resistor of the first differential oscillator,
R3' third resistor of the second differential oscillator,
T1 first transistor of the first differential oscillator,
T1' first transistor of the second differential oscillator,
T2 second transistor of the first differential oscillator,
T2' second transistor of the second differential oscillator,
310 bias point and first point of fundamental frequency AC-ground of the first differential oscillator,
311 bias point and first point of fundamental frequency AC-ground of the second differential oscillator,
320 bias point and second point of fundamental frequency AC-ground of the first differential oscillator,
321 bias point and second point of fundamental frequency AC-ground of the second differential oscillator,
330 third point of fundamental frequency AC-ground of the first differential oscillator,
331 third point of fundamental frequency AC-ground of the second differential oscillator,
340 fourth point of fundamental frequency AC-ground of the first differential oscillator,
341 fourth point of fundamental frequency AC-ground of the second differential oscillator,
350 bias point and fifth point of fundamental frequency AC-ground of the first differential oscillator,
351 bias point and fifth point of fundamental frequency AC-ground of the second differential oscillator.
370 biasing point for second point of fundamental frequency AC-ground of the first and second differential oscillators,
373 biasing inductor,
393 AC coupling element, a capacitor.
FIG. 4, an example of four differential oscillators locked together according to the invention in a star configuration,
410 first differential oscillator,
412 a fundamental frequency AC-ground point of the first differential oscillator,
420 second differential oscillator,
422 a fundamental frequency AC-ground point of the second differential oscillator,
430 third differential oscillator,
432 a fundamental frequency AC-ground point of the third differential oscillator,
440 fourth differential oscillator,
442 a fundamental frequency AC-ground point of the fourth differential oscillator,
450 common coupling point of fundamental frequency AC-ground points,
460 optional biasing impedance, a high AC-impedance and a low DC-impedance, in dependence on which fundamental frequency AC-ground points that are used,
462 optional biasing point of the fundamental frequency AC-ground points.
FIG. 5, an example of four differential oscillators locked together according to the invention in a serial configuration,
510 first differential oscillator,
512 a first fundamental frequency AC-ground point of the first differential oscillator,
514 a second fundamental frequency AC-ground point of the first differential oscillator,
515 optional biasing impedance, a high AC-impedance and a low DC-impedance, in dependence on which fundamental frequency AC-ground points that are used to couple the first and the second differential oscillators,
516 optional biasing point of the fundamental frequency AC-ground points used to couple the first and the second differential oscillators,
520 second differential oscillator,
522 a first fundamental frequency AC-ground point of the second differential oscillator,
524 a second fundamental frequency AC-ground point of the second differential oscillator,
525 optional biasing impedance, a high AC-impedance and a low DC-impedance, in dependence on which fundamental frequency AC-ground points that are used to couple the second and the third differential oscillators,
526 optional biasing point of the fundamental frequency AC-ground points used to couple the second and the third differential oscillators,
530 third differential oscillator,
532 a first fundamental frequency AC-ground point of the third differential oscillator,
534 a second fundamental frequency AC-ground point of the third differential oscillator,
535 optional biasing impedance, a high AC-impedance and a low DC-impedance, in dependence on which fundamental frequency AC-ground points that are used to couple the third and the fourth differential oscillators,

536 optional biasing point of the fundamental frequency AC-ground points used to couple the third and the fourth differential oscillators,

540 fourth differential oscillator,

542 a first fundamental frequency AC-ground point of the fourth differential oscillator,

544 a second fundamental frequency AC-ground point of the fourth differential oscillator,

551 common coupling point of a second fundamental frequency AC-ground point of the first differential oscillator with a second fundamental frequency AC-ground point of the second differential oscillator,

552 common coupling point of a first fundamental frequency AC-ground point of the second differential oscillator with a first fundamental frequency AC-ground point of the third differential oscillator,

553 common coupling point of a second fundamental frequency AC-ground point of the third differential oscillator with a second fundamental frequency AC-ground point of the fourth differential oscillator.

FIG. 6, a first example of multiple frequency locking in a star configuration according to the invention,

610 first differential oscillator having $f_o$ as fundamental frequency,

612 a fundamental frequency AC-ground point of the first differential oscillator,

620 second differential oscillator having $2f_o$ as fundamental frequency,

622 a fundamental frequency AC-ground point of the second differential oscillator,

630 third differential oscillator having $f_o$ as fundamental frequency,

632 a fundamental frequency AC-ground point of the third differential oscillator,

650 common coupling point of fundamental frequency AC-ground points,

660 optional biasing impedance, a high AC-impedance and a low DC-impedance, in dependence on which fundamental frequency AC-ground points that are used,

662 optional biasing point of the fundamental frequency AC-ground points.

FIG. 7, a second example of multiple frequency locking in a star configuration according to the invention,

710 first differential oscillator having $f_o$ as fundamental frequency,

712 a fundamental frequency AC-ground point of the first differential oscillator,

720 second differential oscillator having $2f_o$ as fundamental frequency,

722 a fundamental frequency AC-ground point of the second differential oscillator,

730 third differential oscillator having $f_o$ as fundamental frequency,

732 a fundamental frequency AC-ground point of the third differential oscillator,

740 fourth differential oscillator having $4f_o$ as fundamental frequency,

742 a fundamental frequency AC-ground point of the fourth differential oscillator,

750 common coupling point of fundamental frequency AC-ground points,

760 optional biasing impedance, a high AC-impedance and a low DC-impedance, in dependence on which fundamental frequency AC-ground points that are used,

762 optional biasing point of the fundamental frequency AC-ground points.

What is claimed is:

1. An oscillator circuit comprising:
   a first differential oscillator and a second differential oscillator, the first differential oscillator comprising at least one fundamental frequency AC-ground point, the second differential oscillator comprising at least one fundamental frequency AC-ground point, the first differential oscillator and the second differential oscillator having substantially the same fundamental frequencies,
   a first AC coupling between one of the at least one fundamental frequency AC-ground points of the first differential oscillator and one of the at least one fundamental frequency AC-ground points of the second differential oscillator, thus locking the first differential oscillator to the second differential oscillator.

2. The oscillator circuit according to claim 1, wherein the oscillator circuit comprises a first quadruple frequency output, the first quadruple frequency output being coupled to the first AC coupling.

3. The oscillator circuit according to claim 1, wherein the first differential oscillator and the second differential oscillator are substantially identical.

4. The oscillator circuit according to claim 3, wherein the first AC coupling is between a first fundamental frequency AC-ground point of the first differential oscillator and a first fundamental frequency AC-ground point of the second differential oscillator, the first fundamental frequency AC-ground points being identical fundamental frequency AC-ground points.

5. The oscillator circuit according to claim 4, wherein the oscillator circuit comprises four fundamental frequency outputs, the four outputs being in quadrature.

6. The oscillator circuit according to claim 4, wherein the oscillator circuit comprises a second AC coupling between a second fundamental frequency AC-ground point of the first differential oscillator and a second fundamental frequency AC-ground point of the second differential oscillator, the second fundamental frequency AC-ground points being identical fundamental frequency AC-ground points.

7. The oscillator circuit according to claim 6, wherein the oscillator circuit comprises a second quadruple frequency output, the second quadruple frequency output being coupled to the second AC coupling, the first and second quadruple frequency outputs being differential.

8. The oscillator circuit according to claim 4, wherein the oscillator circuit comprises a third differential oscillator having at least a first fundamental frequency AC-ground point.

9. The oscillator circuit according to claim 8, wherein the first AC coupling is further AC coupled to the first fundamental frequency AC-ground point of the third differential oscillator.

10. The oscillator circuit according to claim 8, wherein the oscillator circuit comprises a second AC coupling between a second fundamental frequency AC-ground point of the first differential oscillator and a second fundamental frequency AC-ground point of the third differential oscillator, the second fundamental frequency AC-ground points being identical fundamental frequency AC-ground points and separate from the first fundamental frequency AC-ground points.

11. The oscillator circuit according to claim 8, wherein the third differential oscillator has substantially a same fundamental frequency as the first and second differential oscillators.

12. The oscillator circuit according to claim 8, wherein the third differential oscillator has a fundamental frequency which is substantially twice the frequency as the fundamental frequencies of the first and second differential oscillators.

13. The oscillator circuit according to claim 8, wherein the oscillator circuit comprises a fourth differential oscillator having at least a first fundamental frequency AC-ground point.

14. The oscillator circuit according to claim 13, wherein the first AC coupling is further AC coupled to the first fundamental frequency AC-ground point of the fourth differential oscillator.

15. The oscillator circuit according to claim 13, wherein the oscillator circuit further comprises a third AC coupling between a fundamental frequency AC-ground point of the second differential oscillator being separate from the first fundamental frequency AC-ground point and a corresponding fundamental frequency AC-ground point of the fourth differential oscillator.

16. The oscillator circuit according to claim 13, wherein the fourth differential oscillator has a fundamental frequency which is substantially the frequency of the fundamental frequency of the first and second differential oscillator.

17. The oscillator circuit according to claim 13, wherein the fourth differential oscillator has a fundamental frequency which is substantially twice the frequency of the fundamental frequency of the first and the second differential oscillator.

18. The oscillator circuit according to claim 13, wherein the fourth differential oscillator has a fundamental frequency which is substantially twice the frequency of the fundamental frequency of the third differential oscillator.

19. The oscillator circuit according to claim 1, wherein one AC coupling between two fundamental frequency AC-ground points is further coupled to a voltage source via an AC-impedance element.

20. The oscillator circuit according to claim 1, wherein one AC coupling between two fundamental frequency AC-ground points, is further coupled to ground via an AC-impedance element.

21. The oscillator circuit according to claim 1, wherein one AC coupling between two fundamental frequency AC-ground points is a direct coupling.

22. The oscillator circuit according to claim 1, wherein one AC coupling between two fundamental frequency AC-ground points is a resistive coupling.

23. The oscillator circuit according to claim 1, wherein one AC coupling between two fundamental frequency AC-ground points is a capacitive coupling.

24. An oscillator circuit comprising at least two differential oscillators, the differential oscillators comprising at least one fundamental frequency AC-ground point each, wherein the oscillator circuit comprises at least one AC coupling between one of the at least one fundamental frequency AC-ground points of one of the differential oscillators and one of the at least one fundamental frequency AC-ground points of another one of the differential oscillators.

25. A communication unit comprising an oscillator circuit according to claim 1.

26. A method of frequency locking a first differential oscillator to a second differential oscillator, the method comprising AC coupling a fundamental frequency AC-ground of the first differential oscillator with a fundamental frequency AC-ground of the second differential oscillator.

* * * * *